(12) United States Patent
Sun et al.

(10) Patent No.: US 9,651,855 B2
(45) Date of Patent: May 16, 2017

(54) METHODS FOR OPTICAL PROXIMITY CORRECTION IN THE DESIGN AND FABRICATION OF INTEGRATED CIRCUITS USING EXTREME ULTRAVIOLET LITHOGRAPHY

(71) Applicant: GLOBALFOUNDRIES, Inc., Grand Cayman (KY)

(72) Inventors: Lei Sun, Albany, NY (US); Wenhui Wang, Clifton Park, NY (US); Ryan Ryoung-Han Kim, Albany, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 170 days.

(21) Appl. No.: 14/685,701

(22) Filed: Apr. 14, 2015

(65) Prior Publication Data

US 2016/0162624 A1    Jun. 9, 2016

Related U.S. Application Data

(60) Provisional application No. 62/089,565, filed on Dec. 9, 2014.

(51) Int. Cl.
| | | |
|---|---|---|
| *G03F 1/22* | (2012.01) | |
| *G03F 1/36* | (2012.01) | |
| *G06F 17/50* | (2006.01) | |
| *H01L 21/027* | (2006.01) | |
| *G03F 7/20* | (2006.01) | |

(52) U.S. Cl.
CPC ............. *G03F 1/22* (2013.01); *G03F 1/36* (2013.01); *G03F 7/2045* (2013.01); *G06F 17/5081* (2013.01); *H01L 21/0274* (2013.01)

(58) Field of Classification Search
CPC . G03F 1/22; G03F 1/36; G03F 7/2045; G06F 17/5081; H01L 21/0274
USPC ................................. 430/5, 30, 311
See application file for complete search history.

(56) References Cited

U.S. PATENT DOCUMENTS

| | | | | |
|---|---|---|---|---|
| 7,055,127 B2 * | 5/2006 | Pierrat | ...................... | G03F 1/68 430/5 |
| 7,735,053 B2 * | 6/2010 | Harazaki | ................... | G03F 1/36 716/53 |
| 8,612,900 B2 * | 12/2013 | Socha | ..................... | G06F 17/50 430/30 |
| 9,223,197 B2 * | 12/2015 | Yu | ............................. | G03F 1/24 |
| 9,377,696 B2 * | 6/2016 | Lu | ....................... | G03F 7/70158 |

* cited by examiner

*Primary Examiner* — Christopher Young
(74) *Attorney, Agent, or Firm* — Lorenz & Kopf, LLP

(57) ABSTRACT

A method of optical proximity correction (OPC) in extreme ultraviolet lithography (EUV) lithography includes providing a patterned layout design including first and second design polygons that correspond with the pre-pattern opening, wherein the first and second design polygons are separated by a separation distance, and correcting the patterned layout design using OPC by generating (1) a third polygon that has dimensions corresponding to a combination of the first and second design polygons and the separation distance and (2) and filled polygon within the third polygon, thereby generating an OPC-corrected patterned layout design. EUV photomasks may be manufactured from the OPC-corrected patterned layout design, and integrated circuits may be fabricated using such EUV photomasks.

18 Claims, 4 Drawing Sheets

METHODS FOR OPTICAL PROXIMITY CORRECTION IN THE DESIGN AND FABRICATION OF INTEGRATED CIRCUITS USING EXTREME ULTRAVIOLET LITHOGRAPHY

CROSS-REFERENCE TO RELATED APPLICATION

This Application claims the benefit of priority to U.S. Provisional Application Ser. No. 62/089,565, which was filed on Dec. 9, 2014, the contents of which are incorporated herein by reference in their entirety.

TECHNICAL FIELD

Embodiments of the present disclosure are generally directed to methods for designing and fabricating integrated circuits. More particularly, embodiments of the present disclosure are directed to methods for optical proximity correction (OPC) in the design and fabrication of integrated circuits using extreme ultraviolet (EUV) lithography.

BACKGROUND

Generally, integrated circuits and other semiconductor devices are used in a variety of electronic applications, such as computers, cellular phones, personal computing devices, and many other applications. Home, industrial, and automotive devices, which in the past included only mechanical components, now have electronic parts that require semiconductor devices.

Semiconductor devices are manufactured by forming many different types of material layers over a semiconductor work-piece or wafer, and patterning the various material layers using lithography. The material layers typically include thin films of conductive, semiconductive, and insulating materials that are patterned and etched to form integrated circuits (IC's). There may be a plurality of transistors, memory devices, switches, conductive lines, diodes, capacitors, logic circuits, and other electronic components formed on a single die or chip.

Lithography involves the transfer of an image of a mask to a material layer of a die or chip, also referred to as a wafer. The image is formed as a network of pre-pattern openings in a layer of photoresist, the photoresist is developed, and the photoresist including the pre-pattern openings is used as a mask during a process to alter the material layer, such as by etching the material layer through the mask to thereby pattern the material layer.

Although various types of photolithographic processes are known in the art, state of the art semiconductor fabrication processes commonly use the 193 nm immersion photolithography to form the pre-pattern openings in the photoresist layer. The next generation lithography technology, "extreme" ultraviolet (EUV) photolithography, is planned to be used commercially after 2020. During semiconductor wafer fabrication, EUV light can be utilized in a lithographic process to enable transfer of very small patterns, such as nanometer-scale patterns, from an EUV lithographic mask (also referred to as an EUV "reticle" in the present application) to a photoresist layer disposed on a semiconductor wafer. A pattern formed on the EUV lithographic mask can be transferred to the photoresist layer by reflecting EUV light off of portions of a reflective surface upon which the EUV lithographic mask is disposed. However, due to the high energy of the EUV light, unwanted light can directly reach areas of the photoresist layer, thereby altering the pattern to be transferred by the mask. As such, patterning issues that are commonly known in the art and associated with EUV photolithography are the scatter of light as a function of density and change in density of light across a large distance.

As feature sizes of semiconductor devices continue to decrease, as is the trend in the semiconductor industry, transferring patterns from a lithography mask to a photoresist layer during fabrication of a semiconductor device becomes more difficult, due to the diffraction effects of the light or energy used to expose the photoresist. For example, during EUV photolithography, a reaction can occur that cleaves the link between the protecting groups and the photoresist material, resulting in shrinkage of the photoresist material. This reaction, and the associated photoresist shrinkage, is accelerated as the photoresist material is heated by the energy of the incident UV waves. Since the full thickness of the photoresist layer is targeted for stabilization, substantial mass loss, and shrinkage, can result from the exposure. Because the interface between the photoresist layer and substrate is constrained, the remainder of the photoresist layer shrinks in three dimensions. This leads to a phenomenon known as "pullback" where the top of the photoresist layer shrinks relative to the bottom. This effect is most pronounced on lithographic features such as contacts, line ends, and feature corners. The pullback phenomenon has undesired effects on the features, which make them unacceptable for device fabrication. This shrinkage occurs throughout the exposed regions of the photoresist layer and can cause deformation in the form of pullback on the upper portions of lithography features.

To compensate for the pullback effect, optical proximity corrections (OPC) are often made to lithography masks, which may involve adjusting the widths or lengths of the lines on the mask that are susceptible to the pullback effect. More advanced methods of OPC correct corner rounding and a general loss of fidelity in the shape of features by adding small secondary patterns, referred to as serifs, to the corners of patterns. The serifs, together with line width changes, enhance the amount of light transmitted through the transparent mask patterns.

As is currently known in the art, OPC methods are applied to a desired semiconductor design to allow the proper pattern to be realized on the silicon wafer using EUV photolithography. Semiconductor designs typically include a plurality of shapes to be drawn (and transferred to the wafer), for example a plurality of polygons. OPC methods computationally simulate the polygons and update the shape of each of the polygons with respect to how neighboring polygons will interact with such polygon, when the pattern is transferred to the photoresist layer using EUV photolithography.

One particular problem that has been encountered in the art of OPC and EUV photolithography is the so-called "tip-to-tip" printability problem, which is a direct result of the pullback effect and other proximity effects. Tip-to-tip printability issues arise in the context of printing neighboring polygons at or near the minimum dimensions allowable for the lithography process. As illustrated in FIG. 1, three circuits 100*a*, 100*b*, and 100*c* are presented. Circuit 100*a* represent a "normal" circuit wherein metal line features 101 and 102 of an upper metallization layer connect through vias 120 and a metal line feature 130 of a lower metallization layer to form a completed electrical circuit (shown by arrows 110). The tip-to-tip distance 105*a* between upper metallization layer metal line features 101 and 102 is defined as the distance between the closest (to one another) ends of the polygons that form the metal line features 101 and 102. Ideally, using EUV lithography, the resulting circuit printed on the semiconductor wafer would be substantially as presented with regard to circuit 100a. However, as is known in the art, the proximity effect may create printability problems wherein the idealized circuit 100a is not achieved with regard to the actual printing of metal line features 101 and 102. For example, as shown with respect to circuit 100b in FIG. 1, the tip-to-tip dimensions 105b have been unintentionally reduced to at or near zero due to EUV proximity problems, which results in a "short" in the electrical circuit 100b. As another example, as shown with respect to circuit 100c, the tip-to-tip dimensions 105c have been unintentionally increased such that the metal line features are not printed to overlie the vias 120, which results in a "disconnect" in the electrical circuit 100c.

The above-described tip-to-tip printability problems encountered in the prior art are further illustrated in FIG. 2 for purposes of comparison with the inventive subject matter described herein (in FIG. 2, the term "tip-to-tip" is written as "T2T" for simplicity). For example, FIG. 2 illustrates a pattern set 200a that includes two mask polygons 211a and the resulting polygon shapes printed on a semiconductor wafer 212a that were created using the two mask polygons 211a. As shown, there is a "pullback" (shown by arrow 221) in the dimensions of the printed polygons 212a as compared to the dimensions of the mask polygons 211a. To correct for this problem using prior art OPC techniques, and with reference now to pattern set 200b, a bias (illustrated by arrow 222) may be added to the desired design polygons 213b, which results in extended polygons 211b when the mask is created. With the bias 222 to the mask polygons 211b, the printed polygons 212b have dimensions that more closely approximate the desired design polygons 213b. However, there is a limit to the closeness of the polygons in the mask, as required by mask rule checks (MRCs). To satisfy MRCs, a minimum distance must be maintained between mask features, as indicated by arrow 223 between mask polygons 211c in mask set 200c of FIG. 2. Thus, due to the bias that must be added, there is a dimensional design limit in the prior art (indicated by polygons 213c) that will satisfy the MRCs, resulting in a corresponding minimum dimension printability limit, indicated by arrow 224, for the printed polygons 212c. With ever decreasing feature sizes on integrated circuits, it would be desirable to find OPC techniques that are not so-constrained.

As such, it is desirable to provide improved OPC techniques for EUV lithography that address the foregoing tip-to-tip printability issue that have been encountered in the prior art. Furthermore, it is desirable to provide such techniques that do not require multiple masks, due the fact that the use of multiple masks would render EUV lithography financially uncompetitive against less expensive traditional lithography techniques (i.e., 193 nm lithography). Furthermore, other desirable features and characteristics of the inventive subject matter will become apparent from the subsequent detailed description of the inventive subject matter and the appended claims, taken in conjunction with the accompanying drawings and this background of the inventive subject matter.

BRIEF SUMMARY

Methods for optical proximity correction in the design and fabrication of integrated circuits are disclosed. The disclosed methods may be used to manufacture EUV photomasks, which may be used in the fabrication of integrated circuits. In an exemplary embodiment, a method of manufacturing an EUV photomask includes designing a pattern for an EUV photomask for forming a pre-pattern opening in a photoresist layer on a semiconductor substrate. Designing the pattern for the EUV photomask includes providing a patterned layout design including first and second design polygons that correspond with the pre-pattern opening. The first and second design polygons are separated by a separation distance. Designing the pattern for the EUV photomask also includes correcting the patterned layout design using optical proximity correction by generating (1) a third polygon that has dimensions corresponding to a combination of the first and second design polygons and the separation distance and (2) and filled polygon within the third polygon, thereby generating an OPC-corrected patterned layout design. Further, designing the pattern for the EUV photomask includes converting the OPC-corrected patterned layout design into a mask writer-compatible format, thereby generating an OPC-corrected, mask writer-compatible layout design including the third polygon and the filled polygon. The method thereafter includes manufacturing the EUV photomask in a mask writer tool using the OPC-corrected, mask writer-compatible layout design as a template for the EUV photomask.

In accordance with another exemplary embodiment, a method for fabricating an integrated circuit includes providing semiconductor substrate including a semiconductor material, forming a photoresist layer over the semiconductor substrate, and providing an extreme ultraviolet photomask. Providing the EUV photomask includes designing a pattern for an EUV photomask for forming a pre-pattern opening in a photoresist layer on a semiconductor substrate. Designing the pattern for the EUV photomask includes providing a patterned layout design including first and second design polygons that correspond with the pre-pattern opening. The first and second design polygons are separated by a separation distance. Designing the pattern for the EUV photomask further includes correcting the patterned layout design using optical proximity correction by generating: (1) a third polygon that has dimensions corresponding to a combination of the first and second design polygons and the separation distance, and (2) a filled polygon within the third polygon, thereby generating an OPC-corrected patterned layout design. Still further, designing the pattern for the EUV photomask includes converting the OPC-corrected patterned layout design into a mask writer-compatible format, thereby generating an OPC-corrected, mask writer-compatible layout design including the third polygon and the filled polygon. Providing the EUV photomask further includes manufacturing the EUV photomask in a mask writer tool using the OPC-corrected, mask writer-compatible layout design as a template for the EUV photomask. The method further includes disposing the EUV photomask over the photoresist layer and directing an EUV light source reflected by the photomask so as to expose a portion of the photoresist layer with the EUV light source.

In accordance with yet another exemplary embodiment, method of optical proximity correction in extreme ultraviolet lithography includes providing a patterned layout design including first and second design polygons that correspond with the pre-pattern opening. The first and second design polygons are separated by a separation distance. The method further includes correcting the patterned layout design using OPC by generating (1) a third polygon that has dimensions corresponding to a combination of the first and second design polygons and the separation distance and (2) and filled polygon within the third polygon, thereby generating an OPC-corrected patterned layout design.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures, and wherein:

DETAILED DESCRIPTION

Figure 1:
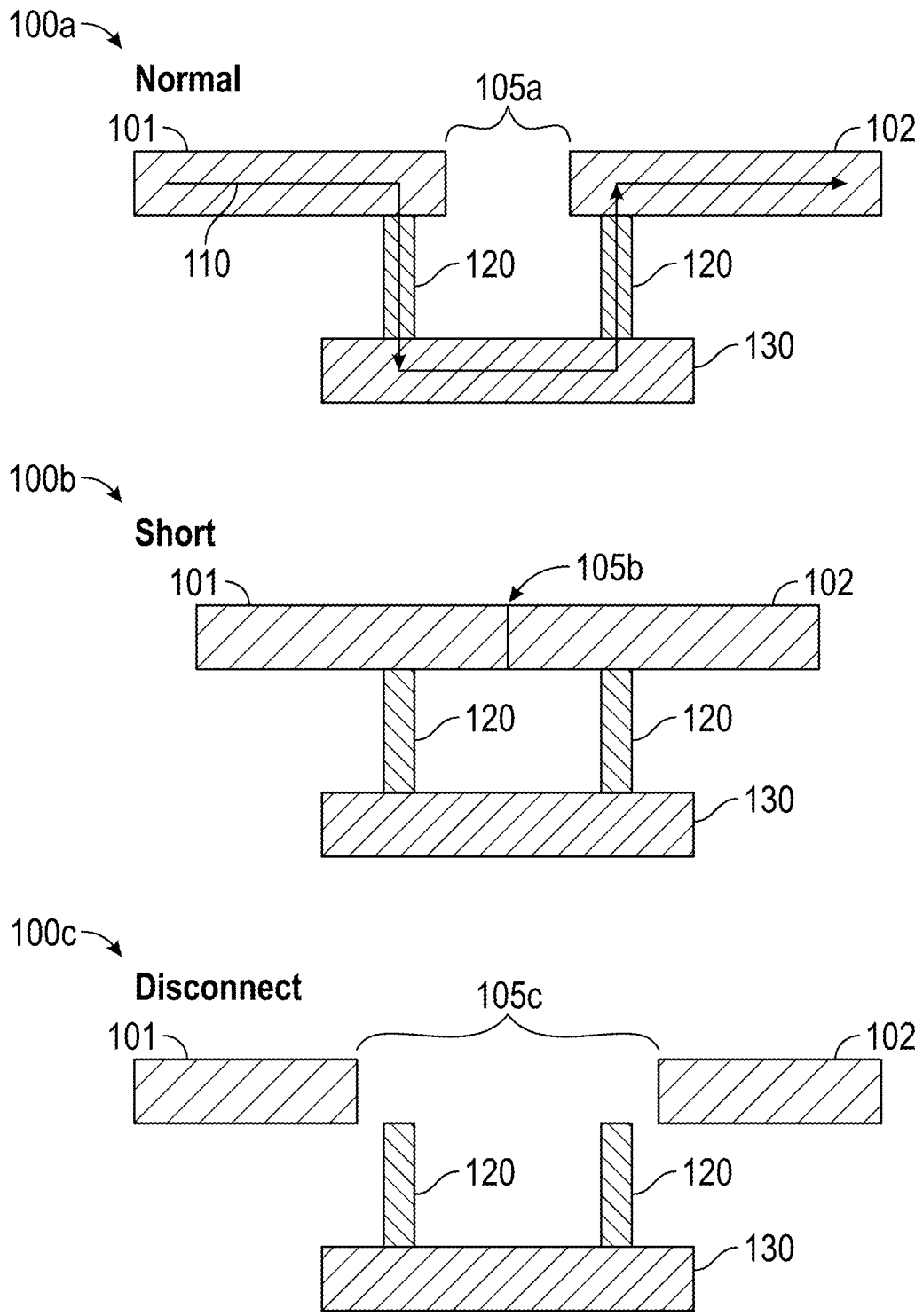
FIG. 1 is a circuit diagram illustrating tip-to-tip printability problems that have been encountered in the prior art.
Figure 2:
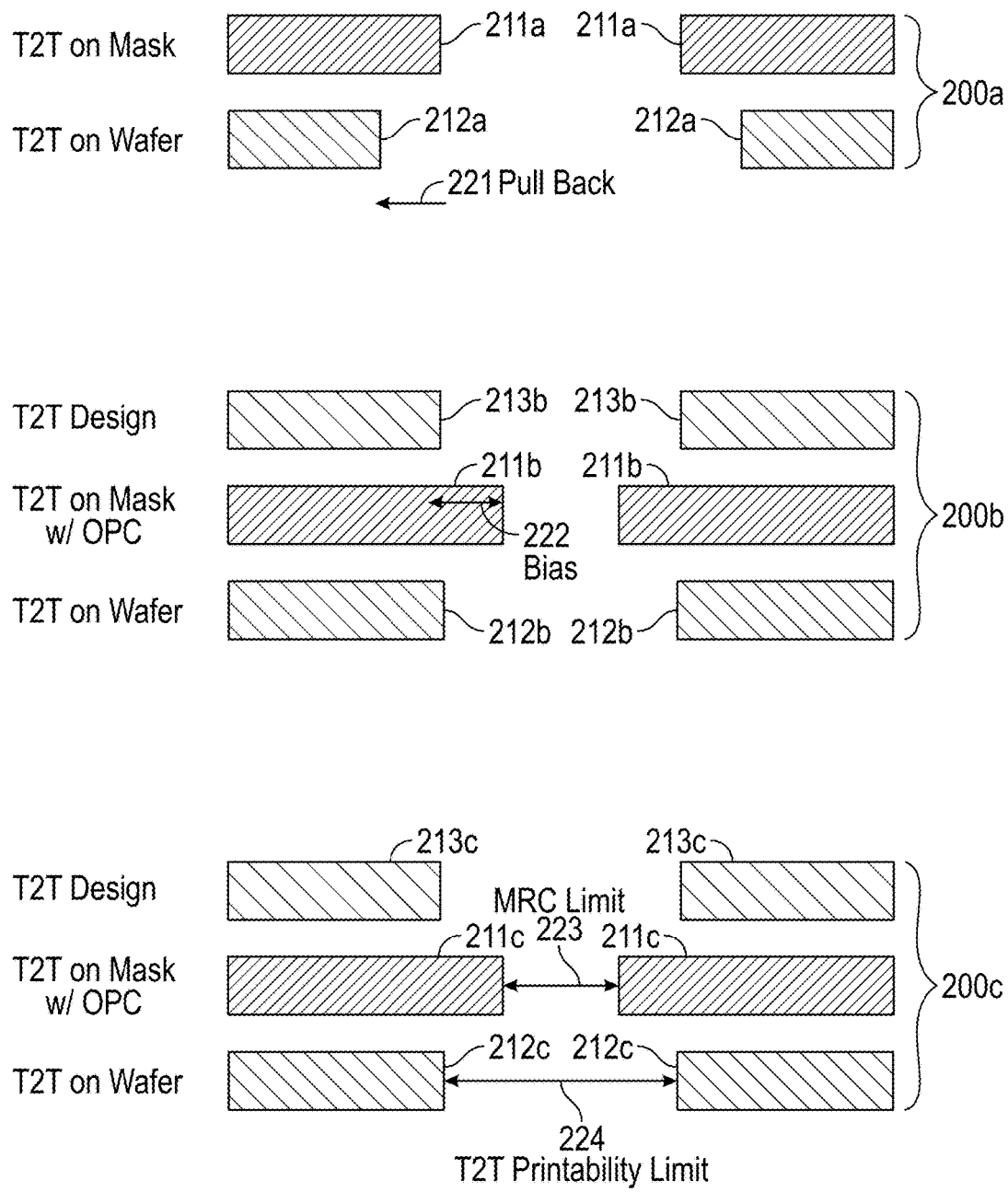
FIG. 2 is an illustration of the pullback effect that is encountered when patterning a semiconductor wafer using EUV lithography.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Embodiments of the present disclosure provide methods for designing an EUV photomask, and the use of such EUV photomasks in the fabrication of integrated circuit structures. The disclosed embodiments are useful in correcting the tip-to-tip printability problems that have been encountered in the prior art. EUV photomasks may be employed in the manufacture of integrated circuits in the following manner as well-known in the art: Electromagnetic radiation in the form of EUV waves are directed reflected by the EUV photo mask and onto a photoresist layer that has been deposited over a semiconductor substrate. The electromagnetic radiation, when contacting the photoresist layer, forms a pre-pattern opening in the photoresist layer. The pre-pattern opening allows for the etching and/or deposition of a plurality of materials onto the semiconductor substrate to form one or more semiconductive transistor structures thereon.

Moreover, the embodiments presented herein provide novel OPC techniques for use in connection with EUV lithography in the design and fabrication of integrated circuits. The OPC techniques set forth herein beneficially increase tip-to-tip printability, that is, using these techniques, the distance between line "tips" may be reduced below what was available in the prior art due to MRC considerations. As will be appreciated, the reduction in tip-to-tip distance will allow for more compact layout designs, which reduces the "footprint" that the integrated circuit requires on the semiconductor substrate thereby enabling overall smaller circuits. Further, the reduction in tip-to-tip distance, due to the reduce footprint, may allow for the implementation of certain advantageous integrated circuit design that were previously not possible due to size constraints. Still further, the OPC techniques set forth herein do not require the use of multiple mask layers, which will assist in making EUV lithography a financially-viable option for large-scale semiconductor fabrication in comparison to conventional 193 nm lithography.

The subject matter is described herein in the context of metal oxide semiconductor (MOS) devices. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. Various steps in the fabrication of MOS semiconductor devices are well known and so, in the interest of brevity, many conventional steps will only be mentioned briefly herein or will be omitted entirely without providing the well-known process details.

Figure 3:
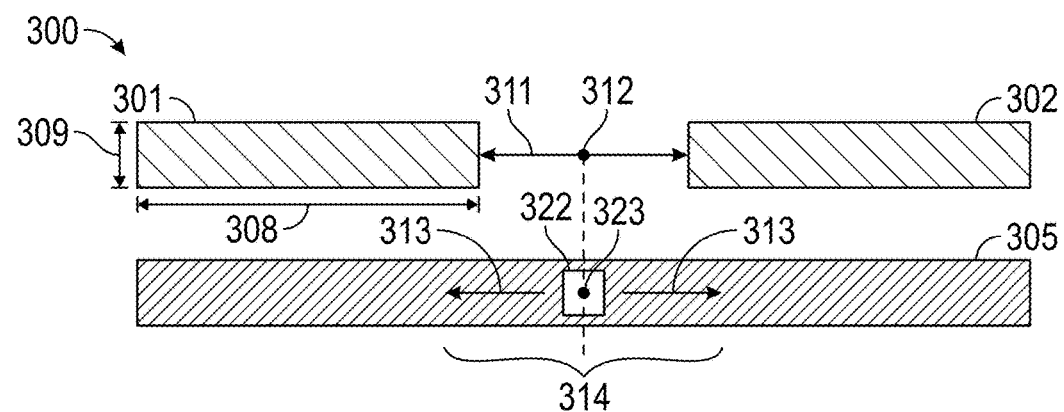
FIGS. 3 and 4 provide illustrations of design polygons and mask polygons generated using OPC techniques on the design polygons in accordance with various embodiments of the present disclosure.

As such, in accordance with certain embodiments of the present disclosure, the novel OPC techniques are presented that improve the optical proximity correction effect to bias the mask polygons to correct for the pullback effect. With reference now to FIG. 3, pattern set 300 includes two desired design polygons 301 and 302 that are illustrated. For example, polygon 301 is illustrated having a length 308 and a width 309, wherein the length is substantially greater than the width (for example, the length 308 may be two or more times greater than the width 309). The length and width of polygon 302 may be the same as polygon 301 or different than polygon 301. Desired design polygons 301 and 302 are separated by a desired design separation distance 311, with midpoint 312 therebetween. In some embodiments, the desired design separation distance 311 may be less than the distance allowable under prior art OPC standards, for a given technology node. As shown, the polygons 301 and 302 may extend co-linearly with one another with respect to their lengths. However, in other embodiments, tip-to-tip printability issues could be encountered in designs wherein the respective polygons are not co-linear, for example they may be at an angle with respect to one another, such as perpendicular. As such, the co-linear illustrations should be considered non-limiting.

In an embodiment, a novel OPC technique is applied to the desired design polygons 301 and 302 to generate a mask polygon 305 which, when used in the fabrication of integrated circuits, will generate a pattern on a photoresist layer with substantially the same dimensions as the desired design polygons 301 and 302 (as used herein, the term "substantially the same dimensions" means having dimensions (i.e., length, width) that vary less than or equal to about 20%, such as less than or equal to about 10%, for example less than or equal to about 5%). Mask polygon 305 not only covers an area corresponding to polygons 301 and 302, but also extends to cover an area 314 that corresponds with separation distance 311. With additional reference now to FIG. 4, mask polygon 305 further includes, wholly with the area 314, a filled polygon 322. Filled polygon 322 is a non-opened area of the mask, i.e., an area that does not allow UV light to pass therethrough, similar to the areas outside of polygon 305. The filled polygon provides a "block" in the middle of the mask polygon 305 that blocks the EUV light in the middle of the mask polygon 305, while allowing light around the filled polygon 322 to pass there-through (areas $A_1$, $A_2$). This combination of features has been surprising discovered to allow for the printing of closer tip proximity, as compared to prior art methods of merely extending the two polygons.

As such, it will be appreciated that embodiments of the present disclosure employ an OPC principle that directly opposes the prior art principles. That is, as described above, the prior art OPC design principle is to begin with the desired polygon design, and bias the ends of the desired polygon design to increase their length, and reduce the distance between the polygons when preparing the mask. In accordance with the embodiments described herein, however, the OPC technique is implemented by first merging the desired design polygons together, and then adding a filled polygon in the merged area. That is, the OPC technique is implemented by generating: (1) the mask polygon 305 that has dimensions corresponding to a combination of the desired design polygons 301, 302 and the separation distance 311, and (2) the filled polygon 322 within the mask polygon 305, thereby generating an OPC-corrected patterned layout design. In this manner, the dimensions of the filled area may be increased lengthwise (as indicated by arrows 313) to accommodate a certain design polygon, as opposed to adding bias length, which proceeds in the opposite direction.

Figure 4:
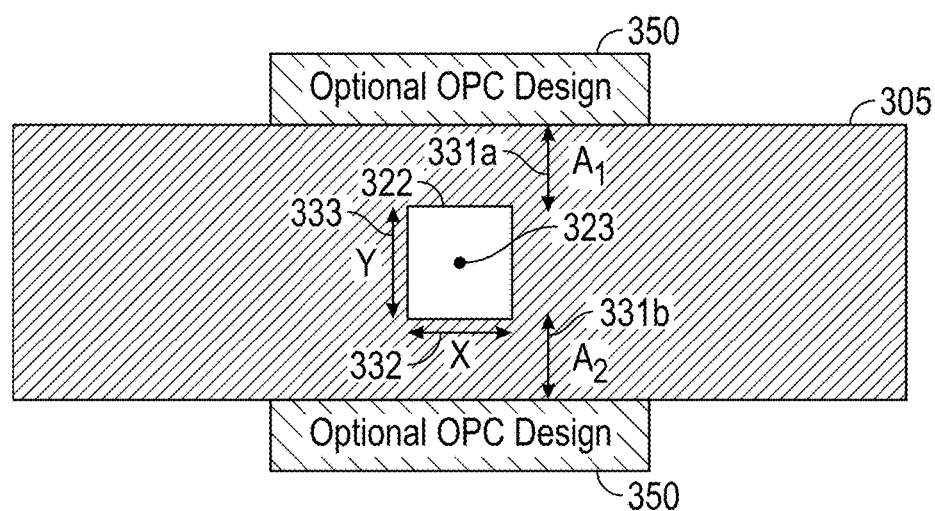

FIG. 4 illustrates the implementation of the filled polygon 322 in accordance with embodiments. Filled polygon 322 has a length X (indicated by arrow 332) and a width Y (indicated by arrow 333). Length X will vary depending on the desired design polygons 301 and 302, and particularly on the desired separation distance 311 therebetween (i.e., greater distances 311 correspond with greater lengths X). The width Y is provided less than the overall width of the desired width of the polygons 309, and as such portions of the mask polygon 305, generally defined by first and second edge spacing distances $A_1$ and $A_2$ (and illustrated by arrows 331a and 331b, respectively), remain on opposing width-ends of the filled polygon 322. In some embodiments, the width Y may be from about 40% to about 90% of the width 309, such as from about 50% to about 80%). As such, portions of the mask polygon 305, within edge spacing distances $A_1$ and $A_2$, are continuous along the entire length of the mask polygon 305 (i.e., are uninterrupted by the filled polygon 322). In some embodiments, $A_1$ and $A_2$ have similar or the same magnitudes, whereas in other embodiments they may vary. Optionally, the magnitude of width Y is as large as possible (according to the particular technology node at issue), and the magnitudes of $A_1$ and $A_2$ are maximized and are substantially equal. In some embodiments, the filled polygon 322 may be centered within the area 314. That is, as best shown in FIG. 3, a midpoint 323 of the filled polygon 322 may correspond with the midpoint 312 of the distance 311.

In accordance with further embodiments of the present disclosure, as shown particularly in FIG. 4, for example in designs wherein edge spacing distances $A_1$ and $A_2$ may be too small to meet MRC requirements, the OPC techniques add width extension portions 350 to the mask polygon 305 within the area 314 in order to locally increase the width of the mask polygon 305. Width extension portions 350 may be provided with a width sufficient to ensure that $A_1$ and $A_2$ meet MRC requirements. The length of extension portions 350 is generally greater than the width X (for example two, three, or more times greater), but generally about the same as or less than the magnitude of distance 311. Optionally, although not required, the dimensions of the width extension portions 350 on opposing width-ends of the polygon mask 305 may be about the same.

Figure 5:
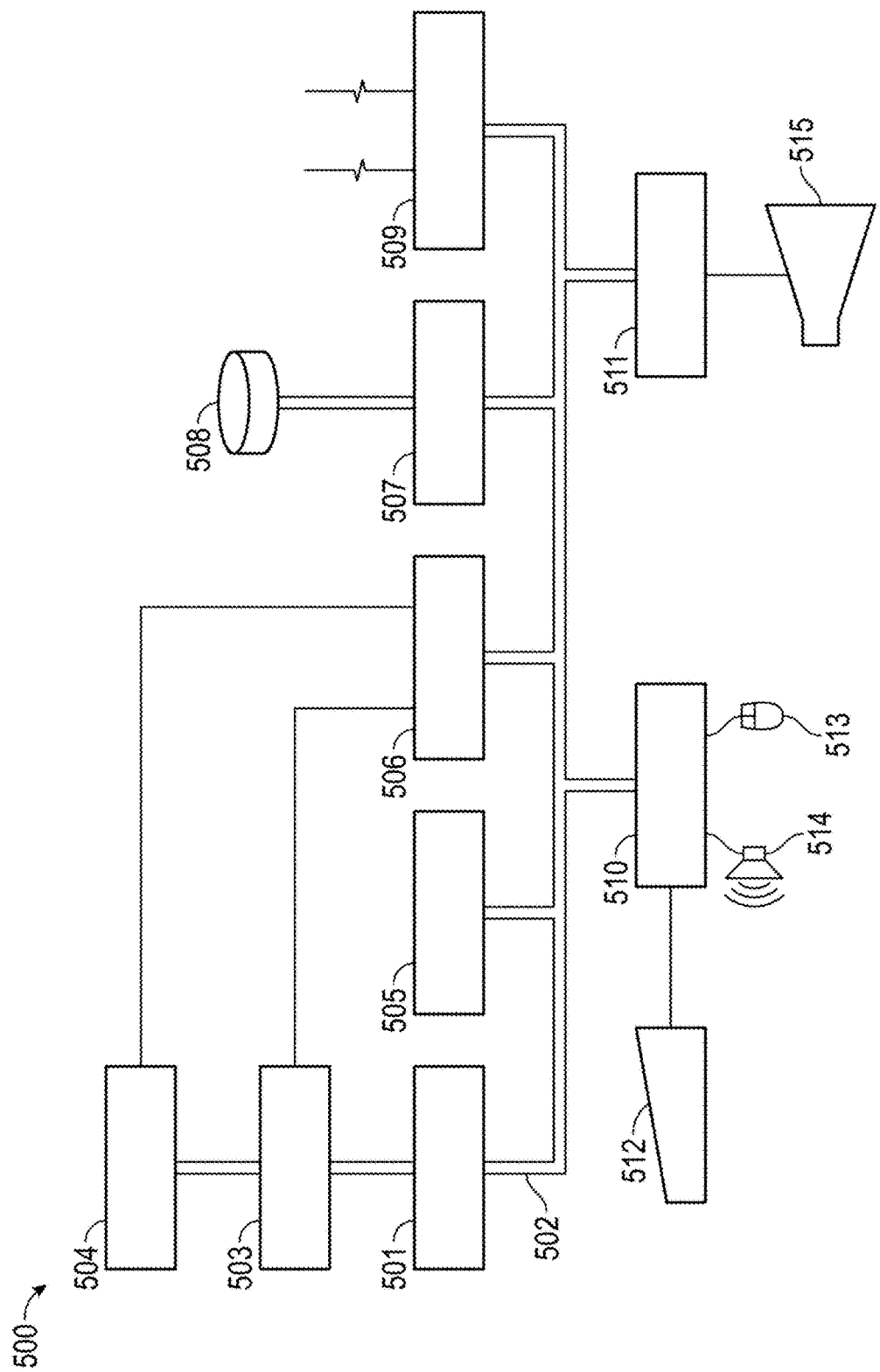
FIG. 5 is a schematic illustration of a block diagram of a computing system arranged in accordance with some embodiments of the present disclosure.

Advantageously, embodiments of the present disclosure can be implemented on one or more computer systems and/or computer-implemented software. That is to say, the desired design polygons 301 and 302 may be generated on one or more computer systems and/or computer-implemented software, the OPC corrections may be implemented using one or more computer systems and/or computer-implemented software, and the corresponding masks may be generated using machinery that is directed by one or more computer systems and/or computer-implemented software. Additionally, one or more computer systems and/or computer-implemented software may be used to convert the OPC-corrected patterned layout design into a mask writer-compatible format, for use in generating a mask writer-compatible layout design, as is known in the art. FIG. 5 is a schematic illustration of a block diagram of a computing system 500 arranged in accordance with some examples. Computer system 500 is also representative of a hardware environment for the present disclosure. For example, computer system 500 may have a processor 501 coupled to various other components by a system bus 502.

Referring to FIG. 5, an operating system 503 may run on computer processor 501, and provide control and coordinate the various OPC and mask design functions as described above. An application 504 in accordance with the principles of examples of the present disclosure may execute in conjunction with operating system 503, and provide calls and/or instructions to operating system 503 where the calls/instructions implement the various functions or services to be performed by application 504 (which can be OPC or mask writer fracturing software).

A read-only memory ("ROM") 505 may be coupled to system bus 502, and can include a basic input/output system ("BIOS") that can control certain basic functions of computer device 500. A random access memory ("RAM") 506 and a disk adapter 507 may also be coupled to system bus 502. This and other non-transitory memory components may be used to store, for example, OPC parameters or application 504 software code. It should be noted that software components, including operating system 503 and application 504, may be loaded into RAM 506, which may be computer system's main memory for execution. A disk adapter 507 may be provided which can be an integrated drive electronics ("IDE") or parallel advanced technology attachment ("PATA") adapter, a serial advanced technology attachment ("SATA") adapter, a small computer system interface ("SCSI") adapter, a universal serial bus ("USB") adapter, an IEEE 1394 adaptor, or any other appropriate adapter that communicates with a disk unit 508, e.g., disk drive.

Computer system 500 may further include a communications adapter 509 coupled to bus 502. Communications adapter 509 may interconnect bus 502 with an external network (not shown) thereby facilitating computer system 500 to communicate with other similar and/or different devices.

Input/output ("I/O") devices may also be connected to computer system 500 via a user interface adapter 510 and a display adapter 511. For example, a keyboard 512, a mouse 513 and a speaker 514 may be interconnected to bus 502 through user interface adapter 510. Data may be provided to computer system 500 through any of these example devices. A display monitor 515 may be connected to system bus 502 by display adapter 511. In this example manner, a user can provide data or other information to computer system 500 through keyboard 512 and/or mouse 513, and obtain output from computer system 500 via display 515 and/or speaker 514.

Accordingly, the foregoing description has provided novel OPC techniques for use in connection with EUV lithography in the design and fabrication of integrated circuits. The OPC techniques set forth herein beneficially increase tip-to-tip printability, that is, using these techniques, the distance between line "tips" may be reduced below what was available in the prior art due to MRC considerations. Furthermore, the OPC techniques set forth herein do not require the use of multiple mask layers, which will assist in making EUV lithography a financially-viable option for large-scale semiconductor fabrication in comparison to conventional 193 nm lithography.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of manufacturing an extreme ultraviolet (EUV) photomask comprising:
   designing a pattern for an EUV photomask for forming a pre-pattern opening in a photoresist layer on a semiconductor substrate, wherein said designing comprises:
      providing a patterned layout design comprising first and second design polygons that correspond with the pre-pattern opening, wherein the first and second design polygons are separated by a separation distance;
      correcting the patterned layout design using optical proximity correction (OPC) by generating: (1) a third polygon that has dimensions corresponding to a combination of the first and second design polygons and the separation distance, and (2) a filled polygon within the third polygon, thereby generating an OPC-corrected patterned layout design; and
      converting the OPC-corrected patterned layout design into a mask writer-compatible format, thereby generating an OPC-corrected, mask writer-compatible layout design comprising the third polygon and the filled polygon; and
   manufacturing the EUV photomask in a mask writer tool using the OPC-corrected, mask writer-compatible layout design as a template for the EUV photomask.

2. The method of claim 1, wherein generating the filled polygon comprises generating a filled polygon within an area of the third polygon corresponding to the separation distance.

3. The method of claim 2, wherein generating the filled polygon comprises generating a filled polygon that is centered length-wise within the area of the third polygon corresponding to the separation distance.

4. The method of claim 1, wherein generating the filled polygon comprises generating a filled polygon having a width that is less than a width either the first or second polygons.

5. The method of claim 4, wherein generating the filled polygon comprises generating a filled polygon having a length that is less than a length of the separation distance.

6. The method of claim 1, wherein providing the patterned layout design comprising first and second design polygons comprises providing a patterned layout design comprising first and second design polygons that have lengths greater than widths, and that are co-linear with respect to one another in a length-wise direction.

7. The method of claim 1, wherein correcting the patterned layout design using OPC further comprises generating: (3) extension portions that locally increase a width of the third polygon in an area of the third polygon corresponding to the separation distance.

8. The method of claim 7, wherein generating the extension portions comprises generating first and second extension portions on opposite width-ends of the third polygon.

9. The method of claim 8, wherein generating the extension portions comprises generating extension portions that have lengths greater than widths.

10. The method of claim 1, wherein the steps of providing, correcting, and converting are performed using computer-implemented software.

11. A method for fabricating an integrated circuit, the method comprising:
   providing a semiconductor substrate comprising a semiconductor material;
   forming a photoresist layer over the semiconductor substrate;
   providing an extreme ultraviolet (EUV) photomask, wherein providing the EUV photomask comprises:
      designing a pattern for an EUV photomask for forming a pre-pattern opening in a photoresist layer on a semiconductor substrate, wherein designing the pattern for the EUV photomask comprises:
         providing a patterned layout design comprising first and second design polygons that correspond with the pre-pattern opening, wherein the first and second design polygons are separated by a separation distance;
         correcting the patterned layout design using optical proximity correction (OPC) by generating: (1) a third polygon that has dimensions corresponding to a combination of the first and second design polygons and the separation distance, and (2) a filled polygon within the third polygon, thereby generating an OPC-corrected patterned layout design; and
         converting the OPC-corrected patterned layout design into a mask writer-compatible format, thereby generating an OPC-corrected, mask writer-compatible layout design comprising the third polygon and the filled polygon; and
      manufacturing the EUV photomask in a mask writer tool using the OPC-corrected, mask writer-compatible layout design as a template for the EUV photomask;
   disposing the EUV photomask over the photoresist layer; and
   directing an EUV light source reflected by the photomask so as to expose a portion of the photoresist layer with the EUV light source.

12. The method of claim 11, wherein providing the patterned layout design comprising first and second design polygons comprises providing a patterned layout design comprising first and second design polygons that have lengths greater than widths, and that are co-linear with respect to one another in a length-wise direction.

13. The method of claim 11, wherein generating the third polygon and the filled polygon comprises generating a third polygon that is continuous along portions of its length that are uninterrupted by the filled polygon.

14. The method of claim 13, wherein generating the third polygon and the filled polygon comprises generating a third polygon that is discontinuous along portions of its length that re interrupted by the filled polygon.

15. The method of claim 11, wherein providing the semiconductor substrate comprises providing a silicon wafer.

16. The method of claim 11, wherein the steps of providing, correcting, and converting are performed using computer-implemented software.

17. The method of claim 11, wherein correcting the patterned layout design using OPC further comprises generating: (3) extension portions that locally increase a width of the third polygon in an area of the third polygon corresponding to the separation distance.

18. The method of claim 17, wherein generating the extension portions comprises generating first and second extension portions on opposite width-ends of the third polygon.

* * * * *